(12) United States Patent
Myeong et al.

(10) Patent No.: US 11,431,317 B2
(45) Date of Patent: Aug. 30, 2022

(54) SURFACE ACOUSTIC WAVE DEVICE

(71) Applicant: WISOL CO., LTD., Gyeonggi-do (KR)

(72) Inventors: Sang Hoon Myeong, Gyeonggi-do (KR); Sang Ki Bae, Gyeonggi-do (KR); Jae Hyun Cho, Gyeonggi-do (KR)

(73) Assignee: WISOL CO., LTD., Gyeonggi-do (KR)

( * ) Notice: Subject to any disclaimer, the term of this patent is extended or adjusted under 35 U.S.C. 154(b) by 12 days.

(21) Appl. No.: 17/094,941

(22) Filed: Nov. 11, 2020

(65) Prior Publication Data

US 2021/0152147 A1 May 20, 2021

(30) Foreign Application Priority Data

Nov. 20, 2019 (KR) .......................... 10-2019-0149618

(51) Int. Cl.
*H03H 9/02* (2006.01)
*H03H 9/145* (2006.01)

(52) U.S. Cl.
CPC .... *H03H 9/02834* (2013.01); *H03H 9/02543* (2013.01); *H03H 9/02842* (2013.01); *H03H 9/145* (2013.01)

(58) Field of Classification Search
CPC .......... H03H 9/02834; H03H 9/02543; H03H 9/02842; H03H 9/145; H03H 9/02826; H03H 9/02858; H03H 9/02881; H03H 9/25; H03H 9/02818; H03H 9/14538; H03H 9/6489
USPC ......................................... 333/133, 193–196
See application file for complete search history.

(56) References Cited

U.S. PATENT DOCUMENTS 10,270,424 B2 * 4/2019 Matsukura ............... H03H 9/64

FOREIGN PATENT DOCUMENTS

| JP | 2013138333 A | 7/2013 |
|---|---|---|
| JP | 2019-068309 A | 4/2019 |
| JP | 2019080093 A | 5/2019 |
| KR | 10-2003-0070384 A | 8/2003 |

(Continued)

OTHER PUBLICATIONS

Office Action from corresponding Korean Patent Application No. 10-2019-0149618 dated Jan. 20, 2021.

(Continued)

*Primary Examiner* — Rakesh B Patel
*Assistant Examiner* — Jorge L Salazar, Jr.
(74) *Attorney, Agent, or Firm* — Harness, Dickey & Pierce, P.L.C.

(57) ABSTRACT

A surface acoustic wave device includes a substrate, a first electrode and a second electrode formed on the substrate to extend along a first direction, wherein the first electrode and the second electrode are alternately disposed along the second direction, one end of the first electrode on one side of the first direction is aligned along the second direction, and one end of the second electrode on the other side of the first direction is aligned along the second direction, a temperature compensation film which covers the first electrode and the second electrode, a first additional film formed on the temperature compensation film to vertically overlap a partial region from the one end of the first electrode on the one side of the first direction, and a second additional film formed on the temperature compensation film to vertically overlap a partial region from the one end of the second electrode.

9 Claims, 14 Drawing Sheets

(56) References Cited

FOREIGN PATENT DOCUMENTS

| KR | 10-2019-0092557 A | 8/2019 |
|----|-------------------|--------|
| WO | WO-2019139076 A1 | 7/2019 |

OTHER PUBLICATIONS

Office Action from corresponding Korean Patent Application No. 10-2019-0149618, dated Jan. 28, 2022.
Office Action from corresponding Korean Patent Application No. 10-2022-0058230, dated Jul. 14, 2022.

* cited by examiner

SURFACE ACOUSTIC WAVE DEVICE

CROSS-REFERENCE TO RELATED APPLICATION

This application claims the benefit under 35 USC § 119(a) of Korean Patent Application No. Korean Patent Application No. 10-2019-0149618, filed on Nov. 20, 2019, in the Korean Intellectual Property Office, the entire disclosure of which is incorporated herein by reference for all purposes.

FIELD

The present invention relates to a surface acoustic wave device, and more particularly, to a surface acoustic wave device capable of reducing energy loss.

BACKGROUND

A surface acoustic wave (SAW) refers to an acoustic wave propagating along a surface of an elastic substrate. Such an acoustic wave is generated from an electrical signal as a result of piezoelectric effect, and if the electric field of the acoustic wave concentrates around the surface of the substrate, the acoustic wave may interact with conductive electrons of another semiconductor, which is put right on the surface of the substrate. A medium through which the acoustic wave propagates is a piezoelectric material having a high electromechanical coupling coefficient and a low acoustic wave energy loss, and the semiconductor is a material with high mobility of conduction electrons and an optimum resistivity, and has a low DC power element, which ensures optimum efficiency. A surface acoustic wave device is to substitute an electric circuit to an electromechanical element by using the interactions between the surface acoustic wave and the conduction electrons.

Such surface acoustic wave devices (hereinafter referred to as "SAW devices") are used not only for various communication applications, but also as an important part of a mobile communication cellular phone and a base station. The most frequently used type of SAW device includes a passband filter and a resonator. Due to their small size and superior technical parameters (low loss, selectivity, etc.) as well as low cost, SAW devices have a substantially higher competitive advantage over devices based on other physical principles.

In particular, as a low insertion loss and a high filtering performance are recently required in the SAW device application field, various attempts have been made to reduce the insertion loss. However, a conventional method of reducing an insertion loss adjusts the spacing between electrodes or uses a plurality of SAW devices, which leads to an increase of the overall size of a module using the SAW device, and hence it is difficult to reduce the size of the module.

Accordingly, development of a new technique which can reduce insertion loss and energy loss without increasing the size of a SAW device is required.

RELATED ART DOCUMENT

Patent Document (Patent Document 0001) Korean Laid-Open Patent Publication No. 10-2003-0070384 (Aug. 30, 2003)

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

An object of the present invention is to provide a surface acoustic wave device capable of reducing insertion loss and energy loss.

In one general aspect, there is provided a surface acoustic wave (SAW) device including: a substrate; a first electrode and a second electrode formed on the substrate to extend along a first direction, wherein the first electrode and the second electrode are alternately disposed along the second direction, one end of the first electrode on one side of the first direction is aligned along the second direction, and one end of the second electrode on the other side of the first direction is aligned along the second direction; a temperature compensation film which covers the first electrode and the second electrode; a first additional film formed on the temperature compensation film to vertically overlap a partial region from the one end of the first electrode on the one side of the first direction; and a second additional film formed on the temperature compensation film to vertically overlap a partial region from the one end of the second electrode on the other side of the first direction.

The first additional film and the second additional film may each be formed as an integrated form extending along the second direction.

The SAW device may further include a reflector disposed in parallel to the first electrode and the second electrode on both sides of the first and second electrodes in the second direction, wherein the first additional film and the second additional film are each formed to also vertically overlap a partial region of the reflector.

The first additional film and the second additional film may be individually formed and arranged for each of a plurality of first electrodes and second electrodes.

The SAW device may further include: a reflector disposed in parallel to the first and second electrodes on both sides of the first and second electrodes in the second direction; and a third additional film and a fourth additional film formed to extend further from arrangement of the first additional film and arrangement of the second additional film, respectively, to both sides of the second direction and arranged to vertically overlap a partial region of the reflector.

A first groove and a second groove may be formed on the temperature compensation film to correspond to shapes of the first additional film and the second additional film, respectively, and the first additional film and the second additional film may be formed in the first groove and the second groove, respectively.

The first additional film and the second additional film may be formed integrally with the temperature compensation film.

The first additional film and the second additional film may be made of any one of silicon oxide ($SiO_2$), silicon nitride ($Si_3N_4$), aluminum oxide ($Al_2O_3$), titanium oxide ($TiO_2$), tantalum oxide ($Ta_2O_5$), hafnium oxide ($HfO_2$), aluminum (Al), copper (Cu), tungsten (W), molybdenum (Mo), and titanium (Ti).

In another general aspect, there is provided a SAW device including: a substrate; a first electrode and a second electrode formed on the substrate to extend along a first direction, wherein the first electrode and the second electrode are alternately disposed along the second direction, one end of the first electrode on one side of the first direction is aligned along the second direction, and one end of the second electrode on the other side of the first direction is aligned along the second direction; a temperature compensation film which covers the first electrode and the second electrode; a protective film which covers the temperature compensation film; a first additional film formed on the protective film to vertically overlap a partial region from the one end of the first electrode on the one side of the first direction; and a second additional film formed on the protective film to vertically overlap a partial region from the one end of the second electrode on the other side of the first direction.

In still another general aspect, there is provided a SAW device including: a substrate; a first electrode and a second electrode formed on the substrate to extend along a first direction, wherein the first electrode and the second electrode are alternately disposed along the second direction, one end of the first electrode on one side of the first direction is aligned along the second direction, and one end of the second electrode on the other side of the first direction is aligned along the second direction; a temperature compensation film which covers the first electrode and the second electrode; a first buffer layer formed of at least one layer on the temperature compensation film and formed to extend along the second direction so as to vertically overlap a partial region from the one end of the first electrode on the one side of the first direction; a second buffer layer formed of at least one layer on the temperature compensation film and formed to extend along the second direction so as to vertically overlap a partial region from the one end of the second electrode on the other side of the first direction; and a first additional film formed on the first buffer layer to vertically overlap a partial region from the one end of the first electrode on the one side of the first direction; a second additional film formed on the second buffer layer to vertically overlap a partial region from the one end of the second electrode on the other side of the first direction.

The first additional film and the second additional film may each be formed as an integrated form extending along the second direction.

The SAW device may further include a reflector disposed in parallel to the first electrode and the second electrode on both sides of the first and second electrodes in the second direction, wherein the first additional film and the second additional film are each formed to also vertically overlap a partial region of the reflector.

The first additional film and the second additional film may be individually formed and arranged for each of a plurality of first electrodes and second electrodes.

The SAW device may further include: a reflector disposed in parallel to the first and second electrodes on both sides of the first and second electrodes in the second direction; and a third additional film and a fourth additional film formed to extend further from arrangement of the first additional film and arrangement of the second additional film, respectively, to both sides of the second direction and arranged to vertically overlap a partial region of the reflector.

A first groove and a second groove may be formed on the temperature compensation film to correspond to shapes of the first buffer layer and the second buffer layer, respectively, and the first buffer layer and the second buffer layer may be formed in the first groove and the second groove, respectively.

The first buffer layer and the second buffer layer may each be formed of at least two layers and the two layers include a low-acoustic-velocity layer and a high-acoustic-velocity layer.

Other features and aspects will be apparent from the following detailed description, the drawings, and the claims.

Figure 1:
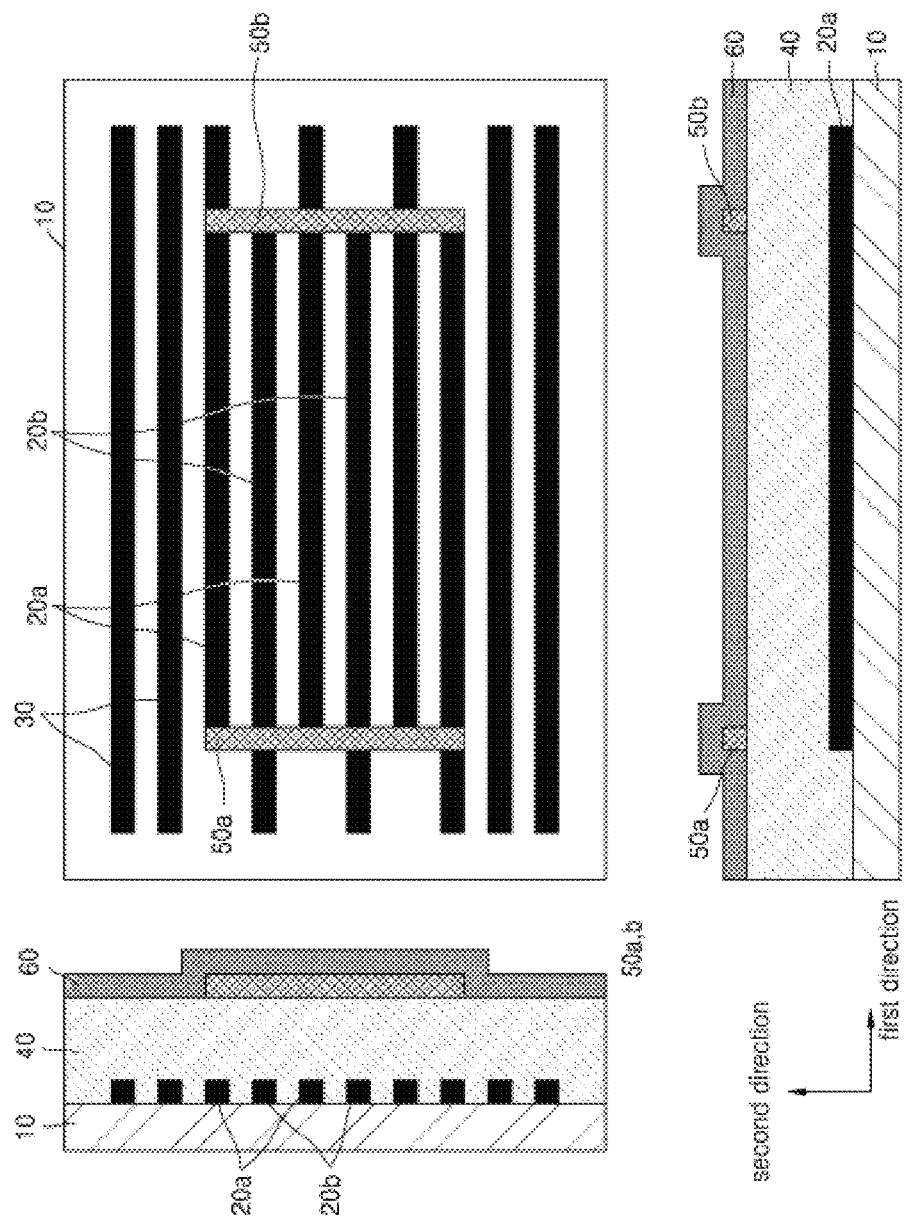
FIG. 1 is a view showing a structure of a surface acoustic wave (SAW) device according to a first embodiment of the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 is a view showing a structure of a surface acoustic wave (SAW) device according to a first embodiment of the present invention.

In the embodiments of the present invention, in order to facilitate understanding of the drawings, it is assumed that a first direction is a horizontal direction and a second direction is a vertical direction, and each drawing shows a top surface of the SAW device, a cross-section of the SAW device in the first direction, and a cross-section of the SAW device in the second direction.

Referring to FIG. 1, the SAW device may include a substrate 10, a first electrode 20*a*, a second electrode 20*b*, and a reflector 30, a temperature compensation film 40, a first additional film 50*a*, a second additional film 50*b*, and a protective film 60, wherein the first electrode 20a, the second electrode 20b, and the reflector 30 may be elongated on the substrate 10 along the first direction, the temperature compensation film 40 may cover the substrate 10, the first and second electrodes 20a and 20b, and the reflector 30, the first additional film 50a and the second additional film 50b may be formed on the temperature compensation film 40, and the protective film may 60 cover the temperature compensation film 40 and the first and second additional films 50a and 50b.

Referring to FIG. 1, for better understanding, the temperature compensation film 40 and the protective film 60 are not shown in a top view, a cross-sectional view in the first direction below the top view is a cross-sectional view of the first electrode 20a, and a cross-sectional view in the second direction on the left side of the top view is a cross-sectional view of the first additional film 50a or the second additional film 50b. As for the cross-sectional views, the same applies to FIGS. 2 to 14.

The substrate 10 is made of a material capable of providing a piezoelectric effect. For example, the substrate 10 is one of a silicon substrate, a diamond substrate, a sapphire substrate, a silicon carbide substrate, a LiNbO3 substrate, and a LiTaO3 substrate.

A plurality of first electrodes 20a and second electrodes 20b may be alternately arranged along the second direction at regular intervals. One end of the first electrode 20a on one side of the first direction (left side in the drawing) is aligned along the second direction, and one end of the second electrode 20b on the other side in the first direction (right side in the drawing) is aligned along the second direction. One of the first electrode 20a and the second electrode 20b may be an input electrode and the other may be an output electrode.

The first direction and the second direction may be perpendicular to each other, and the second direction may be the same direction as a propagation direction of a surface acoustic wave generated by a piezoelectric effect of the SAW device, that is, an acoustic wave.

The reflector 30 may be a plurality of bar-shaped electrodes disposed in parallel to the first and second electrodes 20a and 20 on both sides of the first and second electrodes 20a and 20b in the second direction. The reflector 30 may reflect surface acoustic waves traveling in the second direction along the first and second electrodes 20a and 20b, thereby improving insertion loss.

The temperature compensation film 40 is a film for stabilizing the temperature characteristics of the SAW device. For example, the temperature compensation film 40 may be formed of, for example, silicon oxide ($SiO_2$) material.

The first additional film 50a is formed on the temperature compensation film 40 to extend along the second direction and vertically overlap a partial region from one end of the first electrode 20a on one side of the first direction. The second additional film 50b is formed on the temperature compensation film 40 to extend along the second direction and vertically overlap a partial region from one end of the second electrode 20b on the other side of the first direction.

The protective film 60 is a film for protecting the SAW device. For example, the protective film 60 may be formed of a SiN material. In FIG. 1, the protective film 60 is illustrated as being bent to conform to bends of the additional film 50a and 50b, but the protective film 60 may be formed to be flat irrespective of the shape of the additional films 50a and 50b.

In the case of a conventional SAW device, transverse waves perpendicular to a propagation direction of the surface acoustic waves are generated at the ends of the first and second electrodes 20a and 20b formed on the substrate 10, resulting in loss of surface acoustic wave energy. In the present invention, by forming the first and second additional films 50a and 50b to vertically overlap partial regions from the ends of the first and second electrodes 20a and 20b, it is possible to suppress energy loss at the ends of the first and second electrodes 20a and 20b. Specifically, energy loss refers to a leaky wave of surface acoustic wave due to the generation of a transverse wave. The first and second additional films 50a and 50b may reduce a propagation speed of the surface acoustic wave at the ends of the first and second electrodes 20a and 20b, thereby reducing the amount of energy consumed at the ends of the first and second electrodes 20a and 20b.

According to an embodiment, the first and second additional films 50a and 50b may be made of any one of silicon oxide ($SiO_2$), aluminum oxide ($Al_2O_3$), titanium oxide ($TiO_2$), tantalum oxide ($Ta_2O_5$), hafnium oxide ($HfO_2$), aluminum (Al), copper (Cu), tungsten (W), molybdenum (Mo), and titanium (Ti), and may be made of various dielectric materials capable of reducing the speed of surface acoustic wave.

On the other hand, the additional films may be directly formed on the electrodes, but it is difficult to accurately align the additional films to the electrodes and a process, such as photoresist, is not easy. According to the present invention, by forming the first and second additional films 50a and 50b on the temperature compensation film 40, alignment with the electrodes is easy and the additional films can be formed through a simple process.

Figure 2:
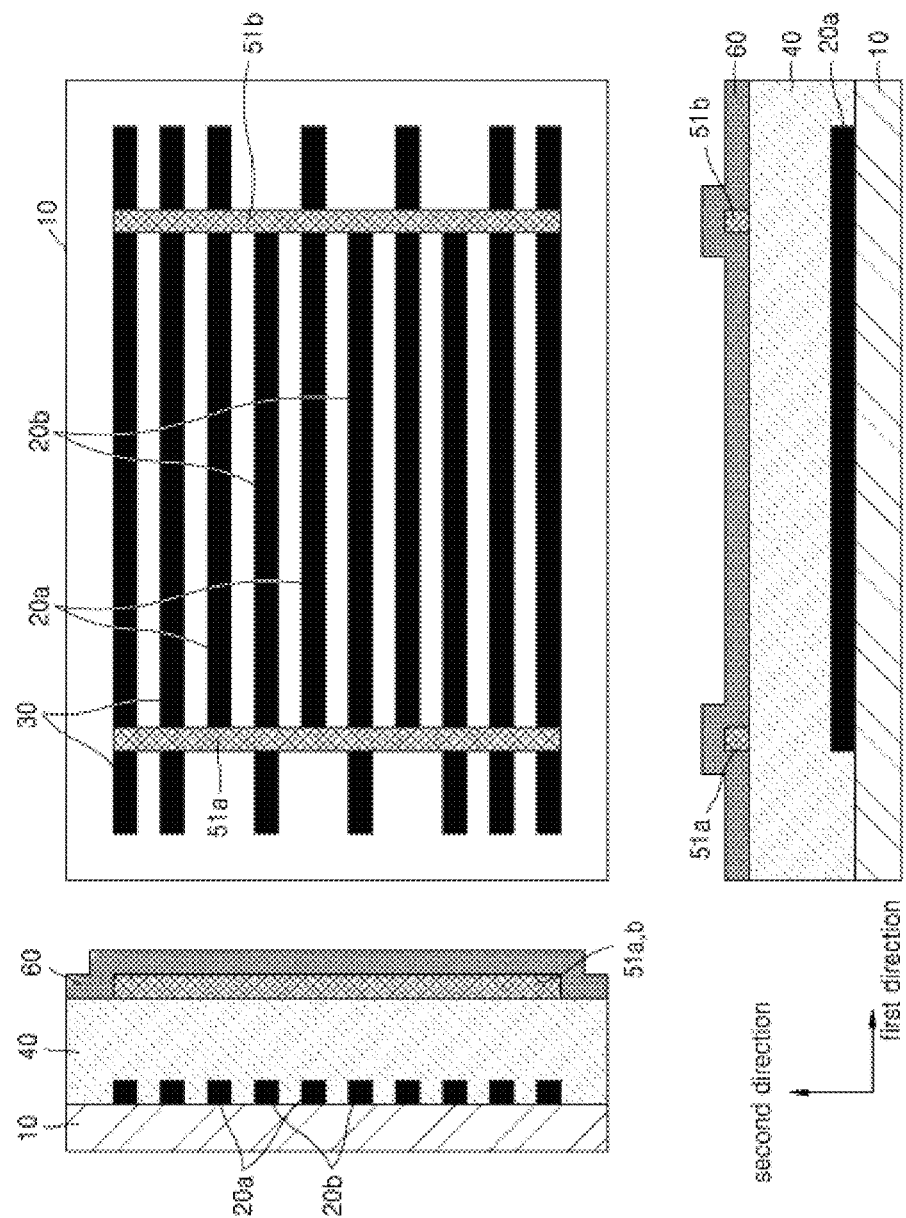
FIG. 2 is a view showing a structure of a SAW device according to a second embodiment of the present invention.

FIG. 2 shows a structure of a SAW device according to a second embodiment of the present invention. For convenience, the following description will focus on differences from the first embodiment.

The first and second additional films 50a and 50b according to the first embodiment are elongated along the second direction so as to overlap the partial regions of the first and second electrodes 20a and 20b, whereas a first additional film 51a and a second additional film 51b according to the second embodiment may be formed to extend further to both sides of the second direction than the first and second additional films 50a and 50b according to the first embodiment and vertically overlap a partial region of a reflector 30.

As the first and second additional films 51a and 51b are formed to overlap the partial regions of the reflector 30, a value of an electromechanical coupling factor K2, which is the vibration conversion efficiency of the SAW device, increases, thereby widening a pass band.

Figure 3:
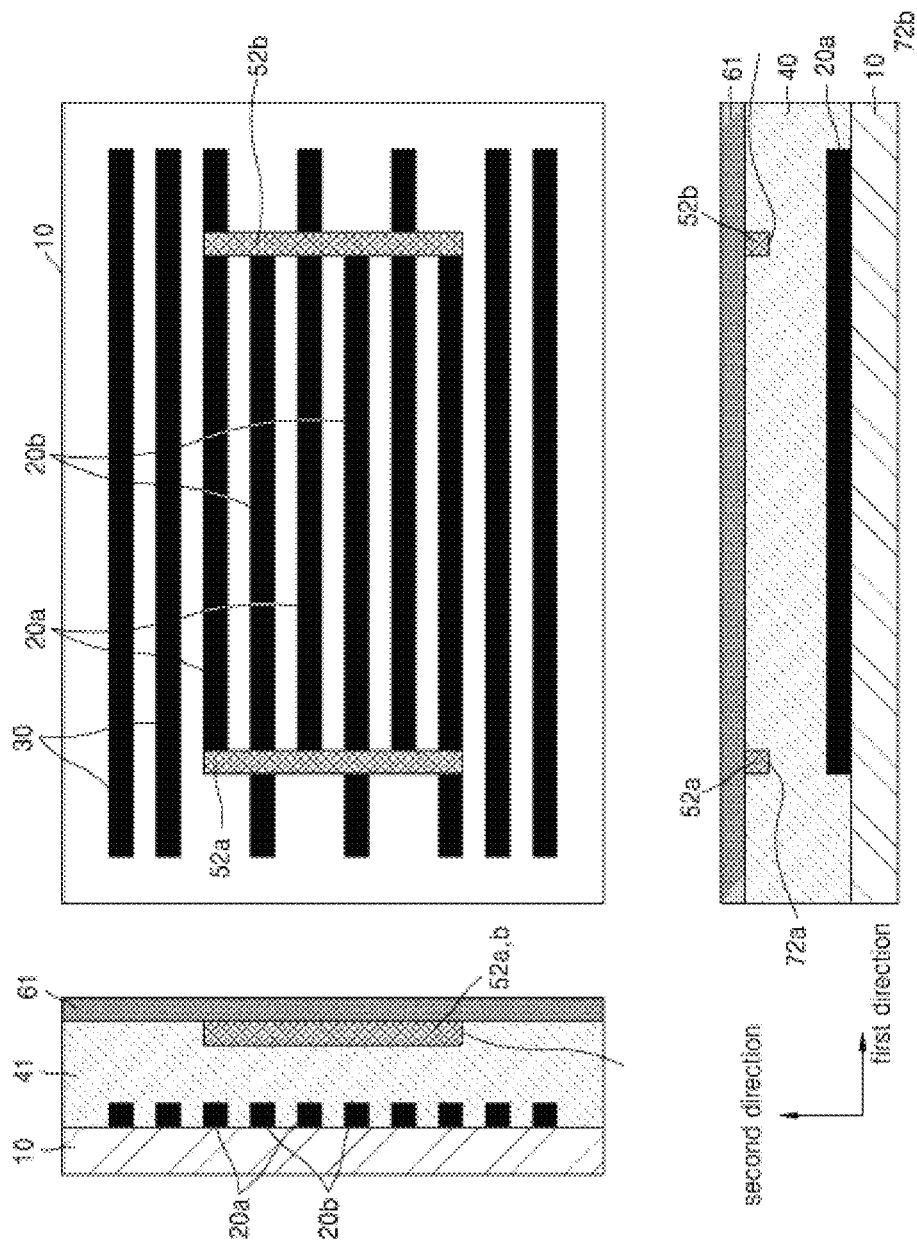
FIG. 3 is a view showing a structure of a SAW device according to a third embodiment of the present invention.

FIG. 3 shows a structure of a SAW device according to a third embodiment of the present invention. For convenience, the following description will focus on differences from the first embodiment.

The first and second additional films 50a and 50b according to the first embodiment are formed to protrude from a flat surface of the temperature compensation film 40, whereas, according to the third embodiment, a first groove 72a and a second groove 72b may be formed on a partial surface region of a temperature compensation film 41 by etching or other methods to correspond to the shape of an additional film to be formed, and a first additional film 52a and a second additional film 52b may be formed by filling the first and second grooves 72a and 72b with a material for the additional film. Accordingly, the protective film 61 may be formed in a flat shape.

Figure 4:
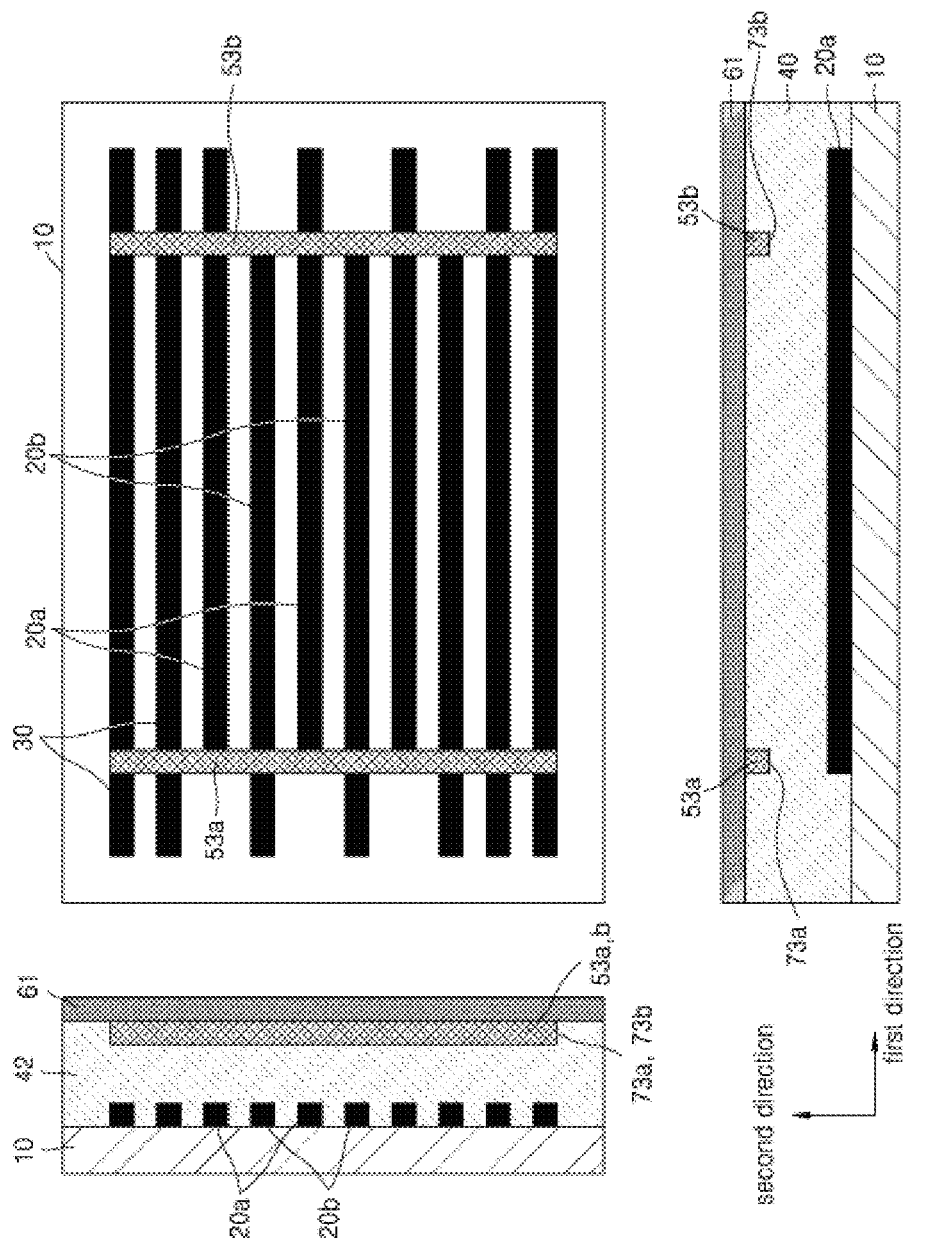
FIG. 4 is a view showing a structure of a SAW device according to a fourth embodiment of the present invention.

FIG. 4 shows a stricture of a SAW device according to a fourth embodiment of the present invention. For convenience, the following description will focus on differences from the third embodiment.

The first and second grooves 72a and 72b and the first and second additional films 52a and 52b according to the third embodiment are elongated along the second direction and overlap partial regions of the first and second electrodes 20a and 20b, whereas a first groove 73a and a second groove 73b according to the fourth embodiment may be formed to further extend in the second direction than the first and second grooves 72a and 72b and the first and second additional films 52a and 52b and overlap a partial region of a reflector 30.

Figure 5:
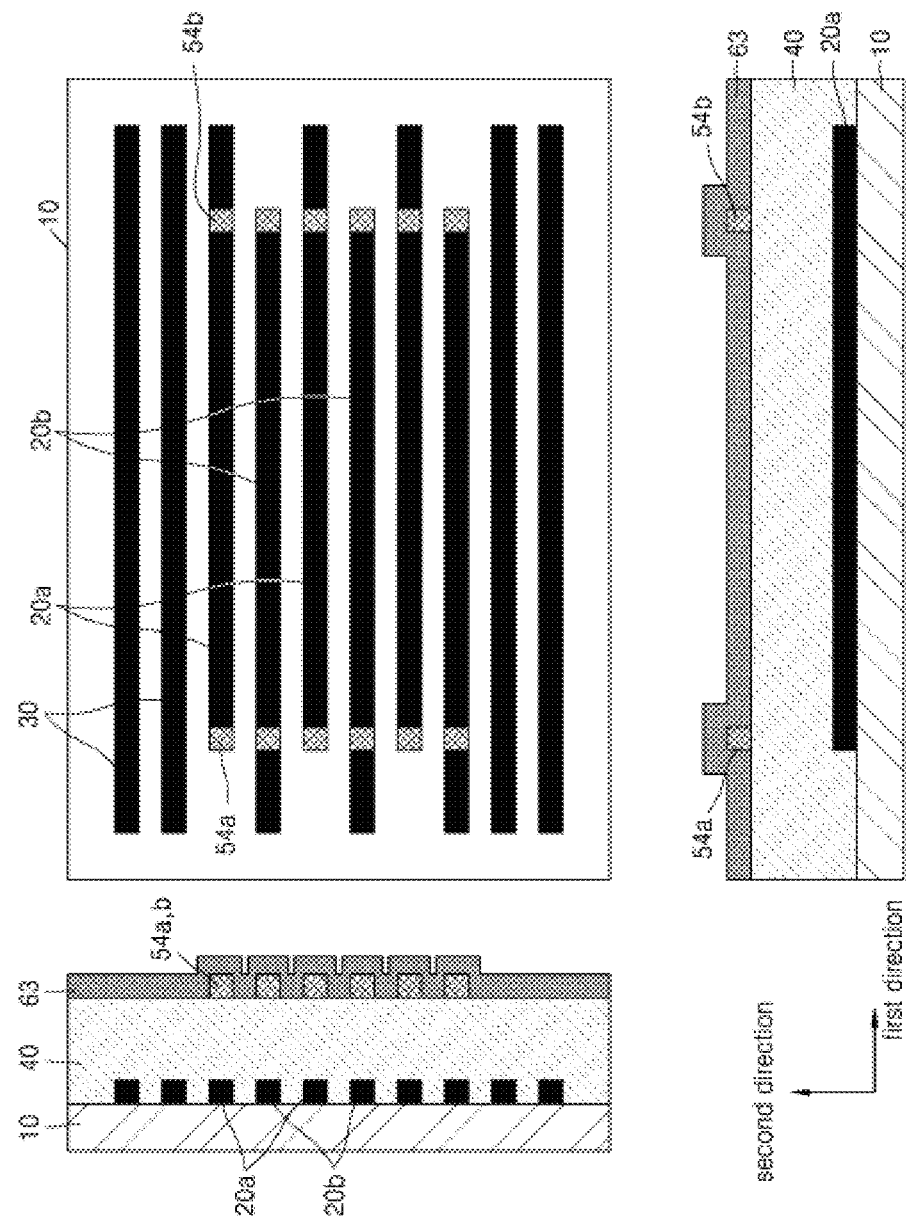
FIG. 5 is a view showing a structure of a SAW device according to a fifth embodiment of the present invention.

FIG. 5 shows a structure of a SAW device according to a fifth embodiment of the present invention. For convenience, the following description will focus on differences from the first embodiment.

The first and second additional films 50a and 50b according to the first embodiment are each formed as an integrated form extending along the second direction, whereas a first additional film 54a and a second additional film 54b according to the fifth embodiment are formed individually (i.e., in a dot shape) for each of a first electrode 20a and a second electrode 20b so as to overlap each of the first and second electrodes 20a and 20b. Accordingly, a protective layer 63 is formed to be bent according to the arrangement of the first and second additional films 54a and 54b. In FIG. 5, the protective film 63 is illustrated as being bent to conform to bends of the additional films 54a and 54b, but the protective film 63 may be formed to be flat irrespective of the shape of the additional films 54a and 54b.

Figure 6:
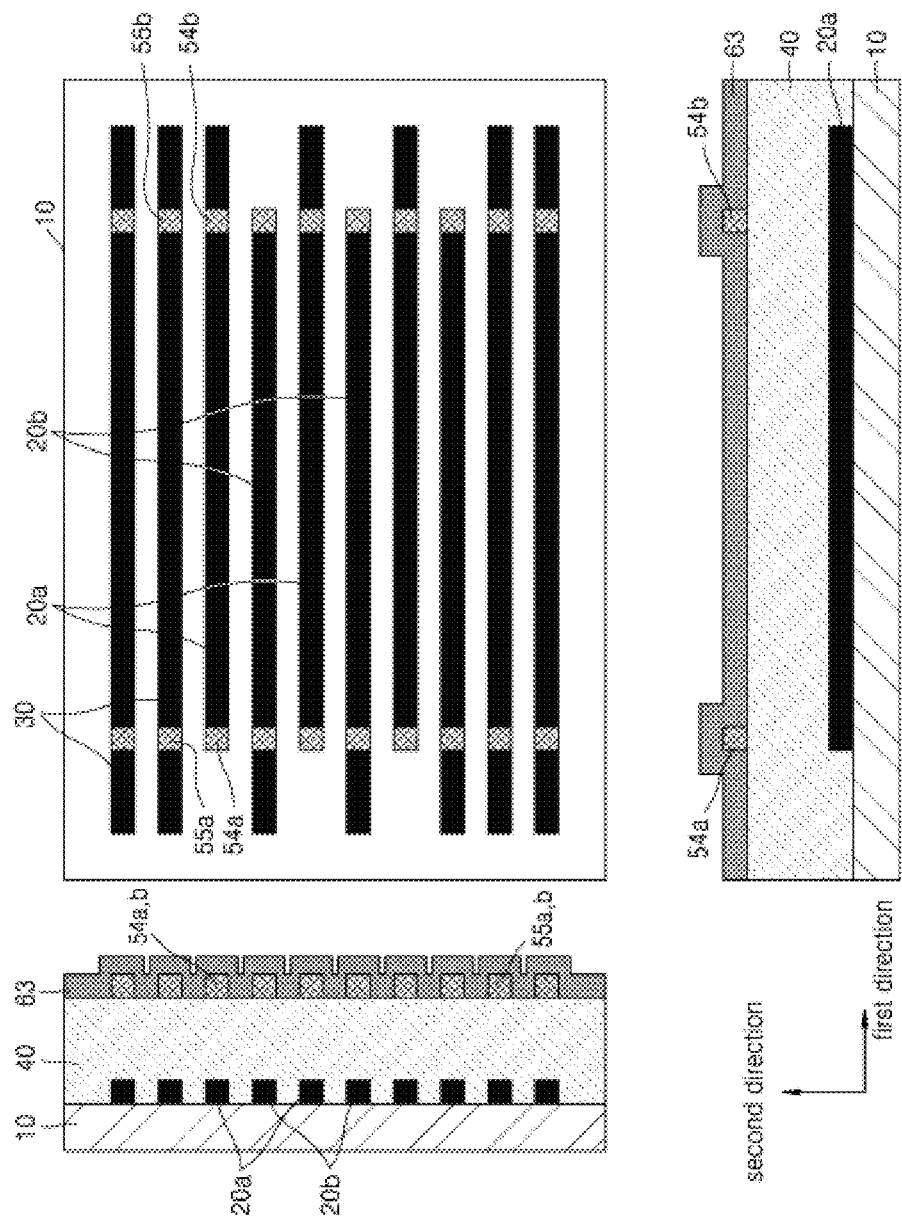
FIG. 6 is a view showing a structure of a SAW device according to a sixth embodiment of the present invention.

FIG. 6 shows a stricture of a SAW device according to a sixth embodiment of the present invention. For convenience, the following description will focus on differences from the fifth embodiment.

According to the sixth embodiment, a third additional film 55a and a fourth additional film 55b may extend further from the arrangement of a first additional film 54a and a second additional film 54b on a temperature compensation film 40 to both sides of the second direction and may be arranged to vertically overlap a partial region of a reflector 30.

Figure 7:
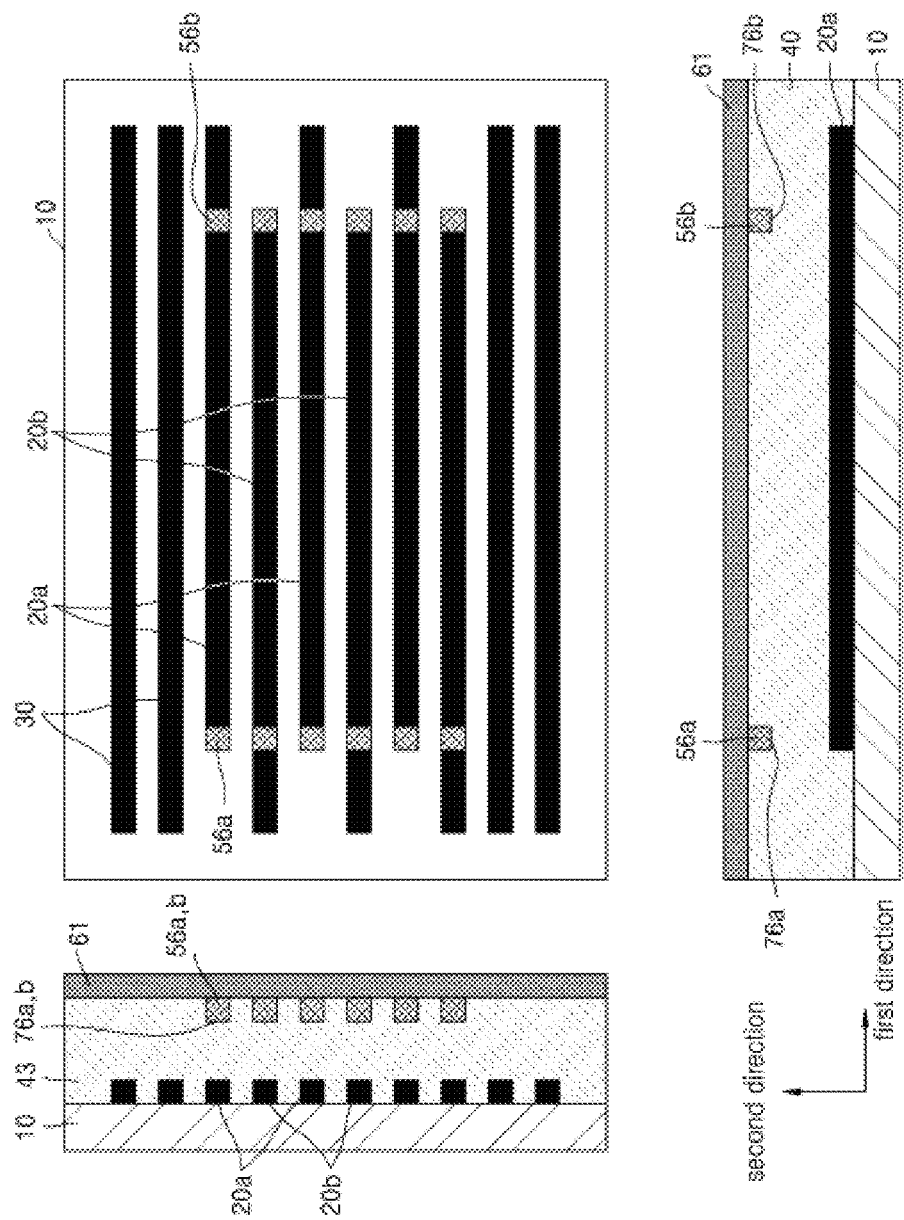
FIG. 7 is a view showing a structure of a SAW device according to a seventh embodiment of the present invention.

FIG. 7 shows a stricture of a SAW device according to a seventh embodiment of the present invention. For convenience, the following description will focus on differences from the fifth embodiment.

The first and second additional films 54a and 54b according to the fifth embodiment are formed to protrude from the flat surface of the temperature compensation film 40, whereas, according to the seventh embodiment, a first groove 76a and a second groove 76b may be formed on a partial surface region of a temperature compensation film 43 by etching or the like to correspond to the shape of an additional film to be formed and a first additional film 56a and a second additional film 56b may be formed by filling the first and second grooves 76a and 76b with a material for the additional film.

Figure 8:
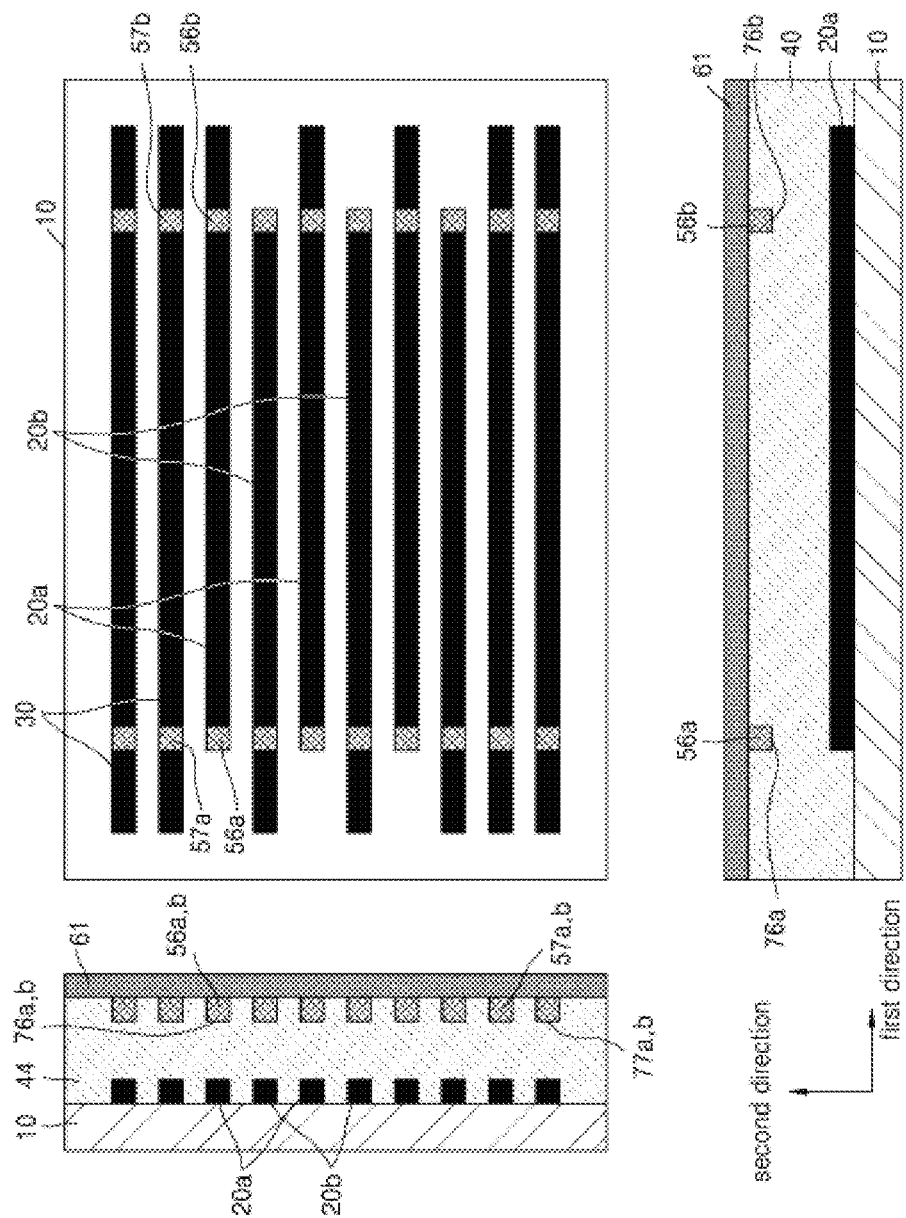
FIG. 8 is a view showing a structure of a SAW device according to an eighth embodiment of the present invention.

FIG. 8 shows a stricture of a SAW device according to an eighth embodiment of the present invention. For convenience, the following description will focus on differences from the seventh embodiment.

According to the eighth embodiment, a third groove 77a and a fourth groove 77b may be formed to extend further from the arrangement of a first groove 76a and a second groove 76b on a temperature compensation film 44 to both sides of the second direction and vertically overlap a partial region of a reflector 30, and a third additional film 57a and a fourth additional film 57b may be formed by filling the third and fourth grooves 77a and 77b with a material for the additional film. Accordingly, the third additional film 57a and the fourth additional film 57b may be formed to extend further from the arrangement of a first additional film 56a and a second additional film 56b to both sides of the second direction and overlap a partial region of a reflector 30.

Figure 9:
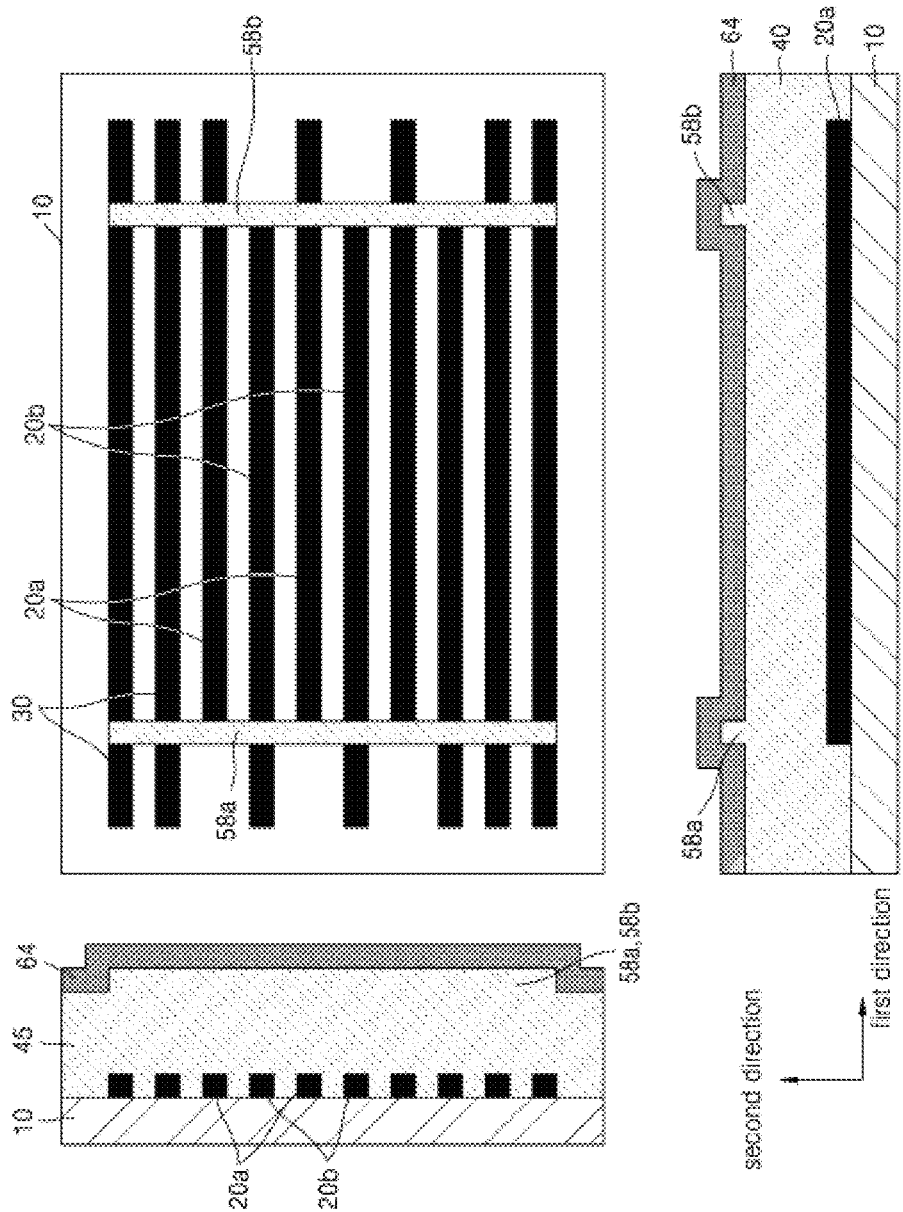
FIG. 9 is a view showing a structure of a SAW device according to a ninth embodiment of the present invention.

FIG. 9 shows a stricture of a SAW device according to a ninth embodiment of the present invention. For convenience, the following description will focus on differences from the second embodiment.

In the second embodiment, if the temperature compensation film 40 and the first and second additional films 51a and 51b are made of the same material (e.g., silicon oxide ($SiO_2$)), the first and second additional films 51a and 51b may be formed on the temperature compensation film 40. However, according to the ninth embodiment, a first additional film 58a and a second additional film 58b may be formed integrally with the temperature compensation film 45 by leaving only the shapes of the first and second additional films 51a and 51b in the temperature compensation film 45 and removing the remaining portions by etching or other methods.

As such, forming the first and second additional films of the same material as the temperature compensation film integrally with the temperature compensation film may apply not only to the first and second additional films of the second embodiment, but also to the first and second additional films according to the first, fifth and sixth embodiments.

Figure 10:
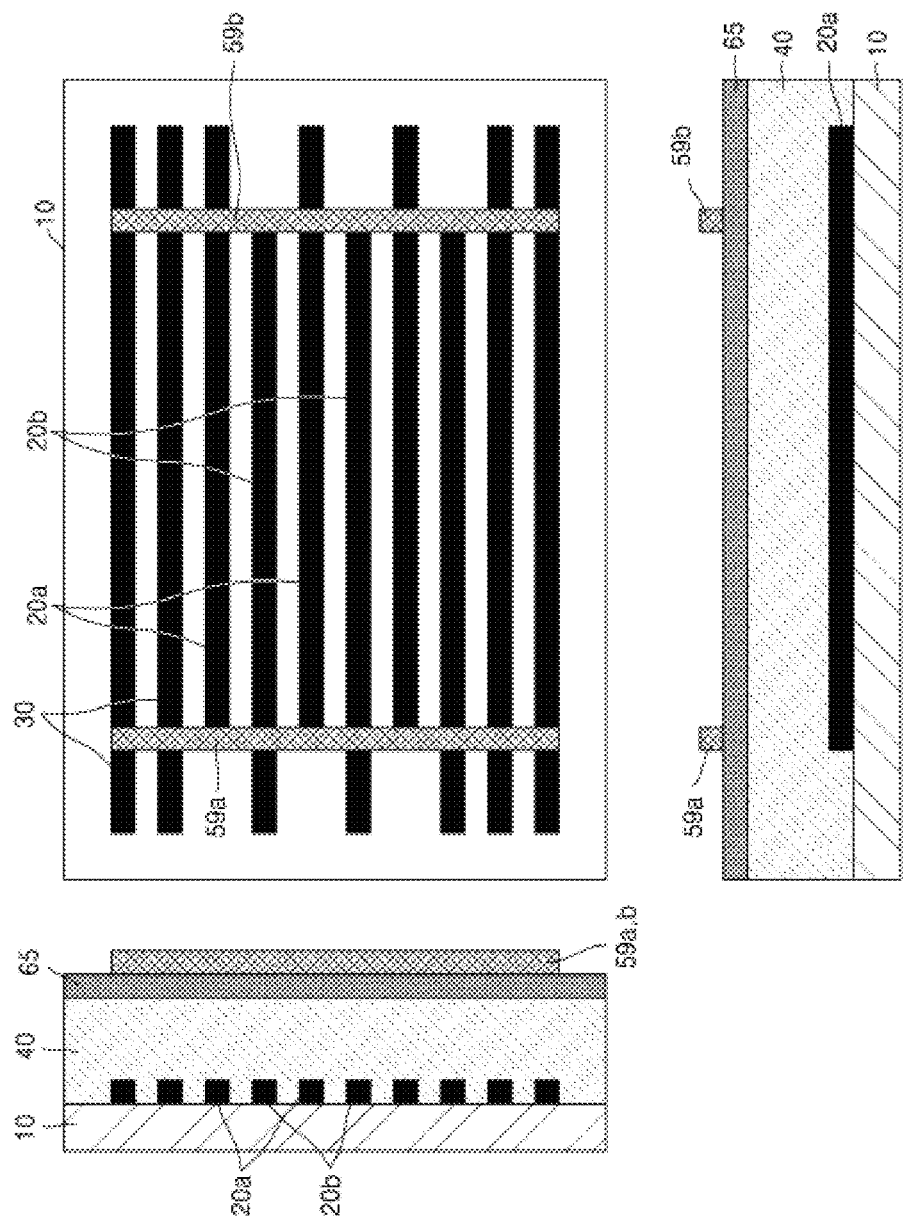
FIG. 10 shows a structure of a SAW device according to a tenth embodiment of the present invention.

FIG. 10 shows a structure of a SAW device according to a tenth embodiment of the present invention. For convenience, the following description will focus on differences from the second embodiment.

In the second embodiment, the first and second additional films 51a and 51b are formed on the temperature compensation film 40 and the protective film 60 covers the temperature compensation film 40 and the first and second additional films 51a and 51b, whereas, according to the tenth embodiment, a protective film 65 may be formed on a temperature compensation film 40 to cover the temperature compensation film and a first additional film 59a and a second additional film 59b may be formed on the protective film 65.

As such, forming the first and second additional films on the protective film may apply not only to the first and second additional films according to the second embodiment, but also to the first and second additional films according to the first, fifth, and sixth embodiments.

Figure 11:
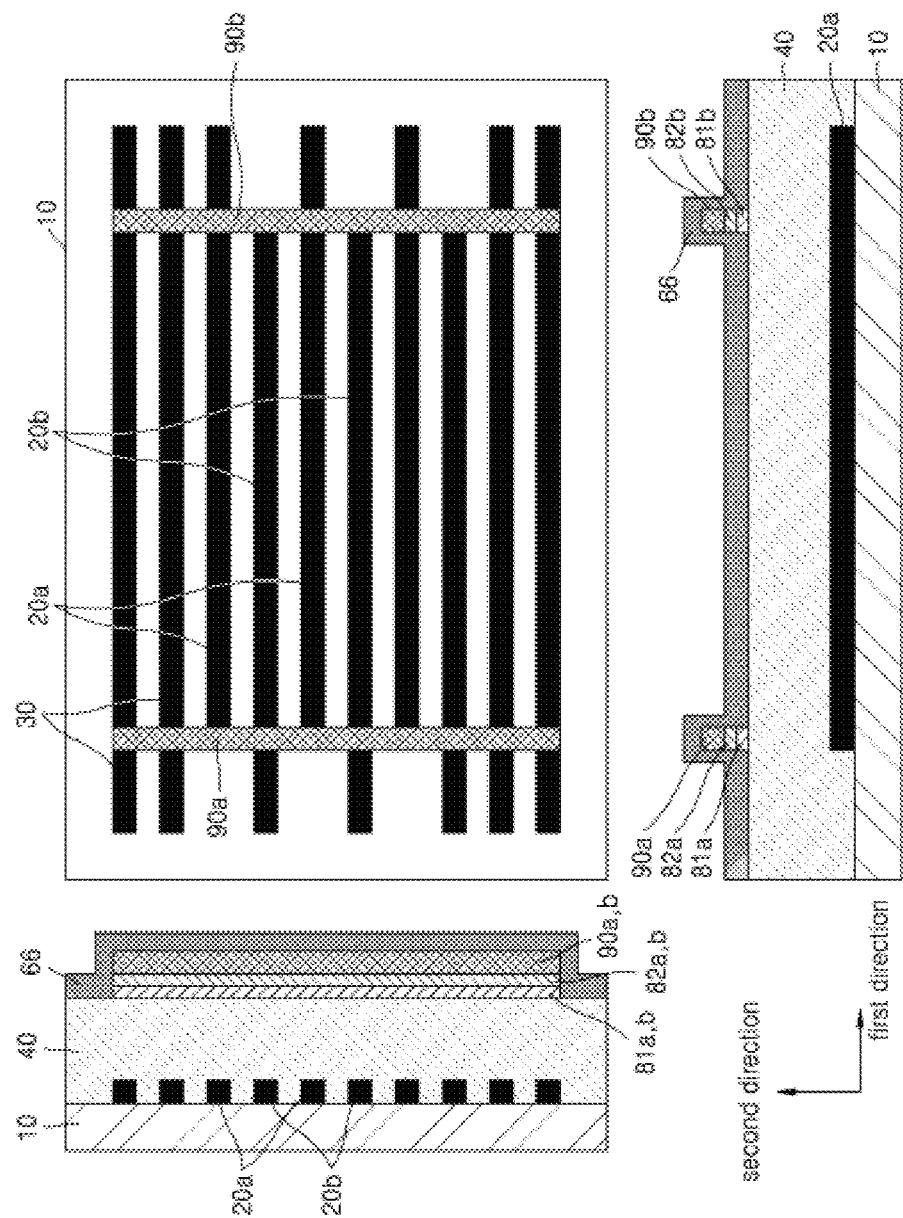
FIG. 11 shows a structure of a SAW device according to an eleventh embodiment of the present invention.

FIG. 11 shows a structure of a SAW device according to an eleventh embodiment of the present invention. For convenience, the following description will focus on differences from the second embodiment.

In the second embodiment, the first and second additional films 51a and 51b are formed directly on the temperature compensation film 40, whereas, according to the eleventh embodiment, first buffer layers 81a and 82a are formed to extend along the second direction to include the same area as a first additional film on a temperature compensation film 40 and second buffer layers 81b and 82b are formed to extend along the second direction to include the same area as the second additional film 51b. Also, a first additional film 90a may be formed on the first buffer layers 81a and 82a, a second additional film 90b may be formed on the second buffer layers 81b and 82b, and a protective film 66 may be formed to cover the temperature compensation film 40, the first buffer layers 81a and 82a, the second buffer layers 81b and 82b, and the first and second additional films 90a and 90b.

The first buffer layers 81a and 82a and the second buffer layers 81b and 82b are provided to increase the transverse wave suppression effect and to improve process convenience, and may be formed of a dielectric film or a metal layer. The dielectric layer may include $HfO_2$, $Ta_2O_5$, $TiO_2$, $SiO_2$, $Si_3N_4$, $Al_2O_3$, AlN, and the like, and the metal layer may include Cr, Al, Ti, or the like. When the buffer layers are formed of a dielectric film, the lower layers 81a and 81b and the upper layers 82a and 82b may be formed of high-acoustic-velocity films and low-acoustic-velocity films, respectively, or vice versa. For example, based on $LiNbO_3$, the low-acoustic-velocity film may include $SiO_2$, $Ta_2O_5$, $HfO_2$, or the like, and the high-acoustic-velocity film may include $Si_3N_4$, $Al_2O_3$, AlN, or the like.

In the present embodiment, the first buffer layers 81a and 82a and the second buffer layers 81b and 82b are formed for two layers, the lower layers 81a and 81b and the upper layers 82a and 82b, but the buffer layer may be formed of one layer, or may be formed of three or more layers.

Figure 12:
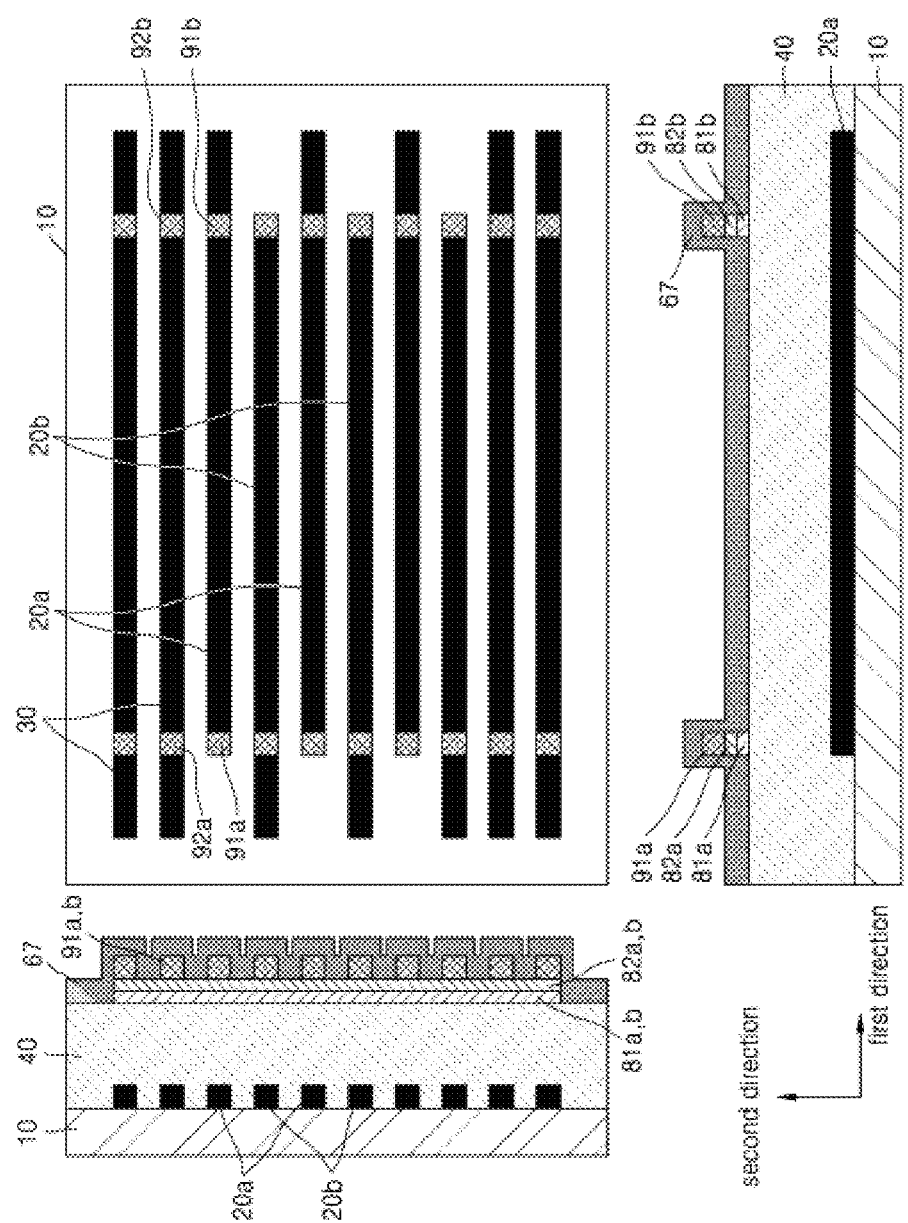
FIG. 12 shows a structure of a SAW device according to a twelfth embodiment of the present invention.

FIG. 12 shows a structure of a SAW device according to a twelfth embodiment of the present invention. For convenience, the following description will focus on differences from the eleventh embodiment.

According to the eleventh embodiment, the first and second additional films 90a and 90b are each formed as an integrated form extending along the second direction, whereas, according to the twelfth embodiment, a first additional film 91a and a second additional film 91b are formed individually (i.e., in a dot shape) for each of a first electrode 20a and a second electrode 20b so as to overlap each of the first and second electrodes 20a and 20b and a third additional film 92a and a fourth additional film 92b may extend further from the arrangement of the first and second additional films 91a and 91b to both sides of the second direction and may be arranged to overlap a partial region of a reflector 30. Accordingly, a protective layer 67 is formed to be bent according to the arrangement of the first and second additional films 91a and 91b and the third and fourth additional films 92a and 92b.

Figure 13:
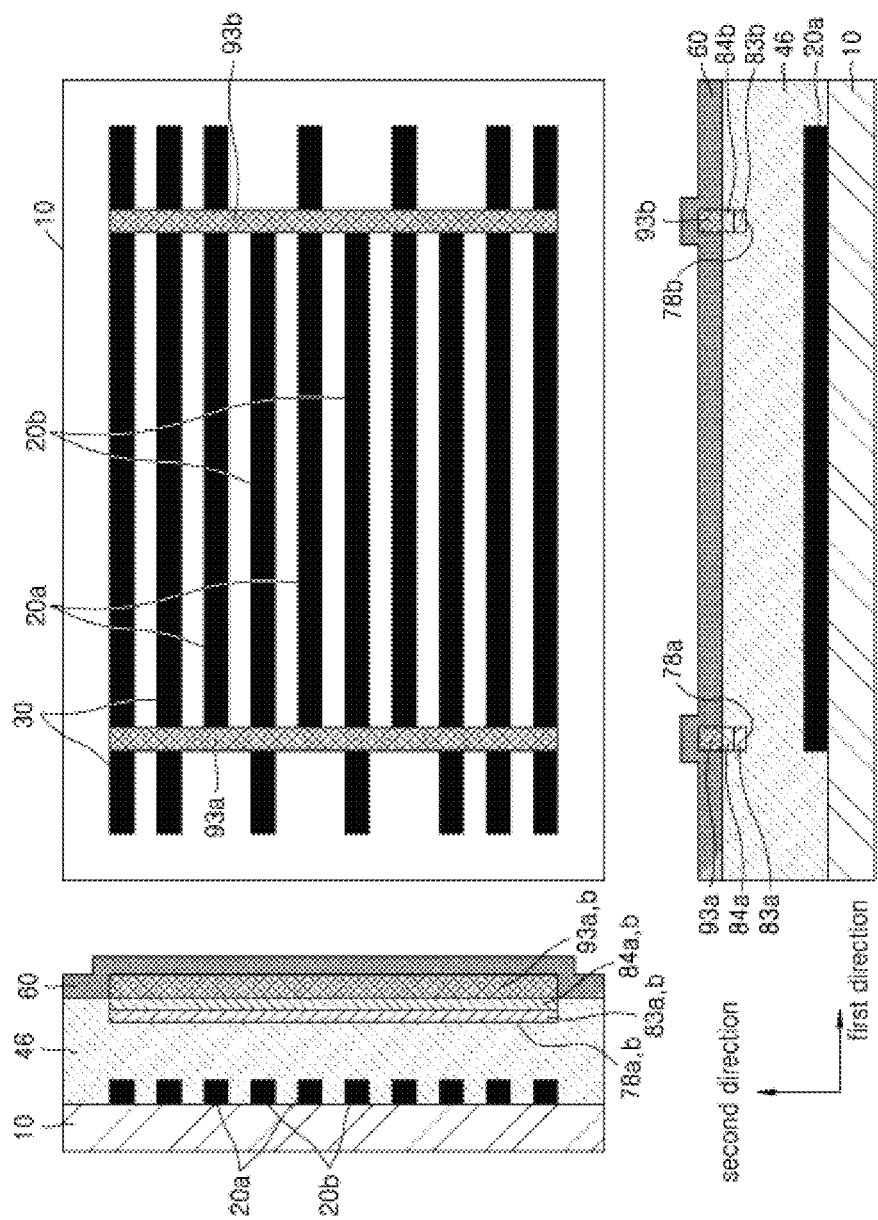
FIG. 13 is a view showing a structure of a SAW device according to a thirteenth embodiment of the present invention.

FIG. 13 shows a structure of a SAW device according to a thirteenth embodiment of the present invention. For convenience, the following description will focus on differences from the eleventh embodiment.

The first to fourth buffer layers 81a, 81b, 82a, and 82b according to the eleventh embodiment are formed to protrude from the flat surface of the temperature compensation film 40, whereas, according to the thirteenth embodiment, a first groove 78a and a second groove 78b may be formed on a partial surface region of a temperature compensation film 46 by etching or other methods to correspond to the shape of a buffer layer to be formed, first to fourth buffer layers 81a, 81b, 82a, and 82b may be formed by filling the first and second grooves 78a and 78b with a material for the buffer layer, and a first additional film 93a and a second additional film 93b may be formed on the third and fourth buffer layers 82a and 82b.

Figure 14:
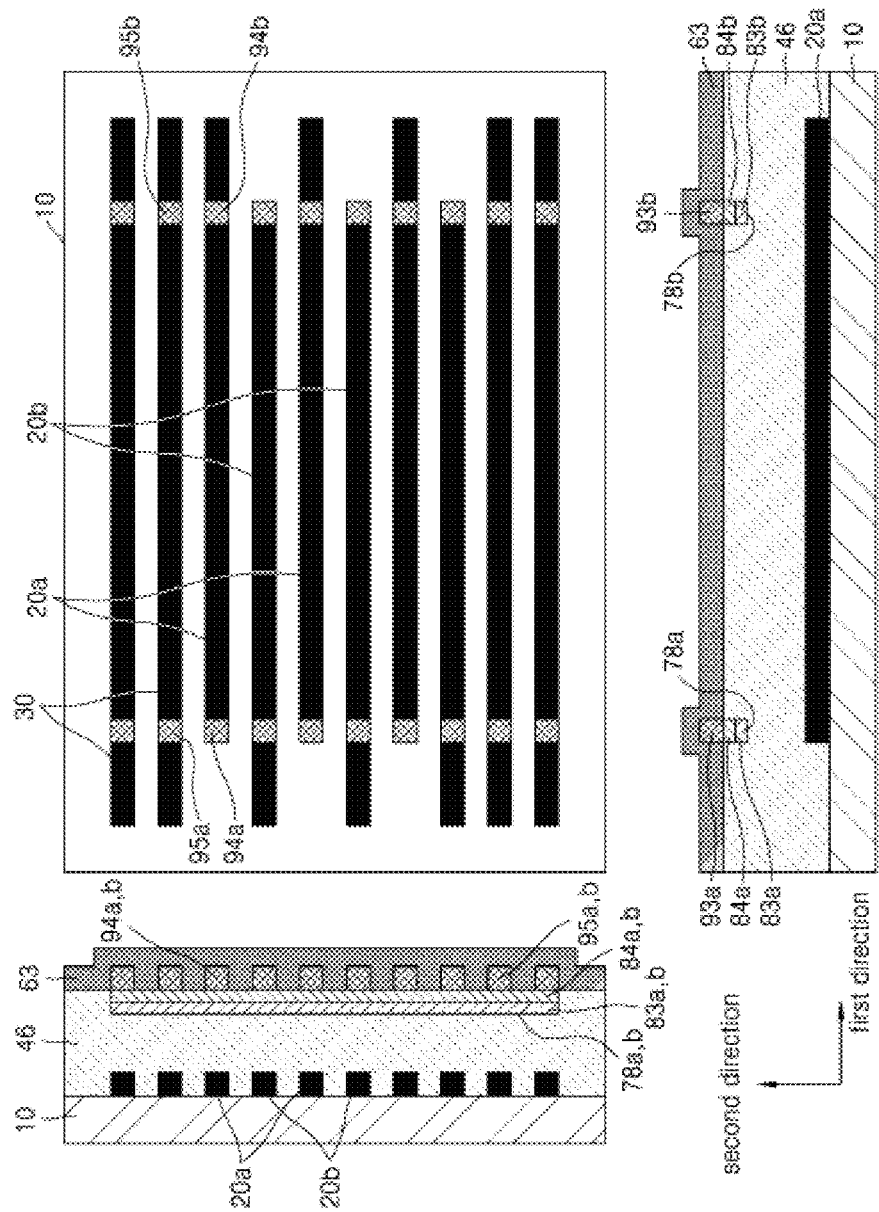
FIG. 14 shows a structure of a surface acoustic wave device according to a fourteenth embodiment of the present invention.

FIG. 14 shows a structure of a surface acoustic wave device according to a fourteenth embodiment of the present invention. For convenience, the following description will focus on differences from the thirteenth embodiment.

According to the thirteenth embodiment, the first and second additional films 93a and 93b are each formed as an integrated form extending along the second direction, whereas, according to the fourteenth embodiment, a first additional film 94a and a second additional film 94b are formed individually (i.e., in a dot shape) for each of a first electrode 20a and a second electrode 20b so as to overlap each of the first and second electrodes 20a and 20b and a third additional film 95a and a fourth additional film 95b may extend further from the arrangement of the first and second additional films 94a and 94b to both sides of the second direction and may be arranged to overlap a partial region of a reflector 30. Accordingly, a protective layer 63 is formed to be bent according to the arrangement of the first and second additional films 94a and 94b and the third and fourth additional films 95a and 95b.

According to the present invention, insertion loss and energy loss of the SAW device can be reduced by forming an additional film on the temperature compensation film so as to vertically overlap a partial region from an end of the electrode.

The effects of the present invention are not limited to those mentioned above, and unmentioned other effects may be clearly understood by those skilled in the art from the above descriptions.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:
1. A surface acoustic wave (SAW) device comprising:
a substrate;
a first electrode and a second electrode formed on the substrate to extend along a first direction, wherein the first electrode and the second electrode are alternately disposed along a second direction, one end of the first electrode on one side of the first direction is aligned along the second direction, and one end of the second electrode on the other side of the first direction is aligned along the second direction;
a temperature compensation film which covers the first electrode and the second electrode;
a first additional film formed on the temperature compensation film to vertically overlap a partial region from the one end of the first electrode on the one side of the first direction;
a second additional film formed on the temperature compensation film to vertically overlap a partial region from the one end of the second electrode on the other side of the first direction, wherein the first additional film and the second additional film are individually formed and arranged for each of a plurality of first electrodes and second electrodes;
a reflector disposed in parallel to the first and second electrodes on both sides of the first and second electrodes in the second direction; and
a third additional film and a fourth additional film formed to extend further from an arrangement of the first additional film and an arrangement of the second additional film, respectively, to both sides of the second direction and arranged to vertically overlap a partial region of the reflector.

2. A surface acoustic wave (SAW) device comprising:
a substrate;
a first electrode and a second electrode formed on the substrate to extend along a first direction, wherein the first electrode and the second electrode are alternately disposed along a second direction, one end of the first electrode on one side of the first direction is aligned along the second direction, and one end of the second electrode on the other side of the first direction is aligned along the second direction;
a temperature compensation film which covers the first electrode and the second electrode;
a first additional film formed on the temperature compensation film to vertically overlap a partial region from the one end of the first electrode on the one side of the first direction; and
a second additional film formed on the temperature compensation film to vertically overlap a partial region from the one end of the second electrode on the other side of the first direction,
wherein a first groove and a second groove are formed on the temperature compensation film to correspond to shapes of the first additional film and the second additional film, respectively, and the first additional film and the second additional film are formed in the first groove and the second groove, respectively.

3. A surface acoustic wave (SAW) device comprising:
a substrate;
a first electrode and a second electrode formed on the substrate to extend along a first direction, wherein the first electrode and the second electrode are alternately disposed along a second direction, one end of the first electrode on one side of the first direction is aligned along the second direction, and one end of the second electrode on the other side of the first direction is aligned along the second direction;
a temperature compensation film which covers the first electrode and the second electrode;
a first buffer layer formed of at least one layer on the temperature compensation film and formed to extend along the second direction so as to vertically overlap a partial region from the one end of the first electrode on the one side of the first direction;
a second buffer layer formed of at least one layer on the temperature compensation film and formed to extend along the second direction so as to vertically overlap a partial region from the one end of the second electrode on the other side of the first direction;
a first additional film formed on the first buffer layer to vertically overlap a partial region from the one end of the first electrode on the one side of the first direction; and
a second additional film formed on the second buffer layer to vertically overlap a partial region from the one end of the second electrode on the other side of the first direction.

4. The SAW device of claim 3, wherein the first additional film and the second additional film are each formed as an integrated form extending along the second direction.

5. The SAW device of claim 4, further comprising a reflector disposed in parallel to the first electrode and the second electrode on both sides of the first and second electrodes in the second direction, wherein the first additional film and the second additional film are each formed to also vertically overlap a partial region of the reflector.

6. The SAW device of claim 3, wherein the first additional film and the second additional film are individually formed and arranged for each of a plurality of first electrodes and second electrodes.

7. The SAW device of claim 6, further comprising:
a reflector disposed in parallel to the first and second electrodes on both sides of the first and second electrodes in the second direction; and
a third additional film and a fourth additional film formed to extend further from an arrangement of the first additional film and an arrangement of the second additional film, respectively, to both sides of the second direction and arranged to vertically overlap a partial region of the reflector.

8. The SAW device of claim 3, wherein a first groove and a second groove are formed on the temperature compensation film to correspond to shapes of the first buffer layer and the second buffer layer, respectively, and the first buffer layer and the second buffer layer are formed in the first groove and the second groove, respectively.

9. The SAW device of claim 3, wherein the first buffer layer and the second buffer layer each are formed of at least two layers and the two layers include a low-acoustic-velocity layer and a high-acoustic-velocity layer.

* * * * *